(12) United States Patent
Zhang

(10) Patent No.: US 10,763,434 B2
(45) Date of Patent: Sep. 1, 2020

(54) MASK PLATE, ORGANIC LIGHT-EMITTING DIODE DISPLAY PANEL, MANUFACTURING METHODS THEREOF, AND DISPLAY DEVICE

(71) Applicant: BOE TECHNOLOGY GROUP CO., LTD., Beijing (CN)

(72) Inventor: Can Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/954,897

(22) Filed: Apr. 17, 2018

(65) Prior Publication Data
US 2019/0019954 A1    Jan. 17, 2019

(30) Foreign Application Priority Data
Jul. 14, 2017    (CN) .......................... 2017 1 0574354

(51) Int. Cl.
| | | |
|---|---|---|
| H01L 51/00 | (2006.01) |
| H01L 51/56 | (2006.01) |
| G03F 7/00 | (2006.01) |
| G03F 7/038 | (2006.01) |
| G03F 7/09 | (2006.01) |
| C23C 14/04 | (2006.01) |
| G03F 7/12 | (2006.01) |
| H01L 27/32 | (2006.01) |

(Continued)

(52) U.S. Cl.
CPC ........ *H01L 51/0011* (2013.01); *C23C 14/042* (2013.01); *G03F 7/0015* (2013.01); *G03F 7/038* (2013.01); *G03F 7/094* (2013.01); *G03F 7/12* (2013.01); *H01L 51/001* (2013.01); *H01L 51/56* (2013.01); *G03F 7/20* (2013.01); *G03F 7/26* (2013.01); *H01L 27/3211* (2013.01)

(58) Field of Classification Search
CPC ... H01L 51/001; H01L 51/0011; H01L 51/00; H01L 51/0002; H01L 51/56; G03F 7/0015; G03F 7/038; G03F 7/094; G03F 7/12; G03F 7/20; G03F 7/26
USPC ......................................................... 438/35
See application file for complete search history.

(56) References Cited

U.S. PATENT DOCUMENTS

| | | |
|---|---|---|
| 9,334,556 B2 | 5/2016 | Sugimoto et al. |
| 9,555,433 B2 | 1/2017 | Sugimoto et al. |

(Continued)

FOREIGN PATENT DOCUMENTS

| | | |
|---|---|---|
| CN | 103797149 A | 5/2014 |
| CN | 103898442 A | 7/2014 |

(Continued)

OTHER PUBLICATIONS

First Office Action, including Search Report, for Chinese Patent Application No. 201710574354.0, dated Jan. 28, 2019, 22 pages.

*Primary Examiner* — Chuong A Luu
(74) *Attorney, Agent, or Firm* — Westman, Champlin & Koehler, P.A.

(57) ABSTRACT

The present disclosure in some embodiments provides a mask plate, including: a metal mask plate body provided with a plurality of first openings; and an insulation film arranged on the metal mask plate body and provided with a plurality of second openings. An orthogonal projection of at least one second opening in the plurality of second openings onto the metal mask plate body falls within the corresponding first opening or first openings.

19 Claims, 4 Drawing Sheets

(51) Int. Cl.
*G03F 7/26* (2006.01)
*G03F 7/20* (2006.01)

(56) References Cited

U.S. PATENT DOCUMENTS

| | | | |
|---|---|---|---|
| 9,555,434 B2 | 1/2017 | Sugimoto et al. | |
| 9,586,225 B2 | 3/2017 | Sugimoto et al. | |
| 9,706,652 B2* | 7/2017 | Ryu | H05K 3/4007 |
| 10,195,838 B2 | 2/2019 | Saito et al. | |
| 2003/0146695 A1* | 8/2003 | Seki | H01L 27/3246 |
| | | | 313/506 |
| 2004/0135498 A1 | 7/2004 | Takanosu et al. | |
| 2006/0240338 A1* | 10/2006 | Satoh | H01L 21/0272 |
| | | | 430/5 |
| 2011/0108313 A1* | 5/2011 | Kung | H05K 3/062 |
| | | | 174/261 |
| 2014/0151672 A1* | 6/2014 | Yamada | H01L 51/5234 |
| | | | 257/40 |
| 2014/0199808 A1* | 7/2014 | Sugimoto | B05B 12/20 |
| | | | 438/99 |
| 2015/0284839 A1 | 10/2015 | Sugimoto et al. | |
| 2016/0001542 A1 | 1/2016 | Saito et al. | |
| 2016/0193623 A1 | 7/2016 | Sugimoto et al. | |
| 2016/0194745 A1 | 7/2016 | Sugimoto et al. | |
| 2017/0036230 A1 | 2/2017 | Mizumura | |
| 2017/0047506 A1* | 2/2017 | Annunziata | H01L 43/02 |
| 2019/0221620 A1* | 7/2019 | Li | H01L 51/5262 |

FOREIGN PATENT DOCUMENTS

| | | |
|---|---|---|
| CN | 104404446 A | 3/2015 |
| CN | 105051243 A | 11/2015 |
| CN | 105555991 A | 5/2016 |
| CN | 105612271 A | 5/2016 |
| CN | 105980098 A | 9/2016 |
| CN | 106232857 A | 12/2016 |
| CN | 106479371 A | 3/2017 |
| CN | 106816554 A | 6/2017 |
| TW | 200421456 A | 10/2004 |

\* cited by examiner

MASK PLATE, ORGANIC LIGHT-EMITTING DIODE DISPLAY PANEL, MANUFACTURING METHODS THEREOF, AND DISPLAY DEVICE

CROSS-REFERENCE TO RELATED APPLICATION

The present application claims a priority of the Chinese patent application No. 201710574354.0 filed on Jul. 14, 2017, which is incorporated herein by reference in its entirety.

TECHNICAL FIELD

The present disclosure relates to the field of display technology, in particular to a mask plate, an organic light-emitting diode (OLED) display substrate, manufacturing methods thereof, and a display device.

BACKGROUND

OLED display has attracted more and more attentions due to such unique advantages as rapid response, fully-solid state and self-luminescence. In addition, the OLED display may be applied to various fields, e.g., flexible display, transparent display and micro-display.

Currently, a full-color display effect of the OLED display may be achieved in two modes. In a first mode, light-emitting materials may be evaporated directly using a Fine Metal Mask (FMM) so as to form red (R), blue (B) and green (G) subpixels. In a second mode, the color display effect may be achieved using white-OLED (WOLED) plus a color filter. In the case of evaporating the light-emitting materials using the FMM to form the R, G and B subpixels, it is unnecessary to provide any color filter, so no brightness loss may occur. In addition, the light-emitting materials have relatively high luminous efficiency, so it is able to acquire the display with a large color gamut and a large brightness value.

However, due to the limitation of the FMM precision, it is merely able to manufacture the OLED display having a Pixel Per Inch (PPI) value up to 400 through the FMM in the related art. Currently, there are more and more applications where a higher PPI value is required. For example, in the field of micro-display, it is unable for the 400PPI display to meet the requirements of human eyes. Hence, there is an urgent need to find a scheme for manufacturing the OLED display with a higher PPI value through the FMM.

SUMMARY

In one aspect, the present disclosure provides in some embodiments a mask plate, including: a metal mask plate body provided with a plurality of first openings; and an insulation film arranged on the metal mask plate body and provided with a plurality of second openings. An orthogonal projection of at least one second opening in the plurality of second openings onto the metal mask plate body falls within the corresponding first opening or first openings. Here, the orthogonal projection of at least one second opening in the plurality of second openings onto the metal mask plate body falls within the corresponding first opening or first openings includes the following two situations. The first situation is that the orthogonal projection of at least one second opening in the plurality of second openings onto the metal mask plate body completely falls within an area of the corresponding first opening or first openings. And the second situation is that the orthogonal projection of at least one second opening in the plurality of second openings onto the metal mask plate body completely coincides with an area of the corresponding first opening or first openings.

In a possible embodiment of the present disclosure, the plurality of second openings corresponds to the plurality of first openings in a one-to-one correspondence.

In a possible embodiment of the present disclosure, the plurality of second openings is arranged in an array form, and a pitch between two adjacent second openings in a row direction is not smaller than twice of a width of each second opening in the row direction.

In a possible embodiment of the present disclosure, the width of each second opening in the row direction is not greater than 4.4 m, and the pitch between the two adjacent second openings in the row direction is not greater than 8.4 μm.

In a possible embodiment of the present disclosure, the insulation film is divided by the plurality of second openings into a plurality of insulation patterns, and a cross section of each insulation pattern in a direction perpendicular to the metal mask plate body is of a trapezoidal shape.

In a possible embodiment of the present disclosure, the cross section of each insulation pattern from top to bottom in a direction perpendicular to the metal mask plate body is of an inverted-trapezoidal shape.

In a possible embodiment of the present disclosure, the insulation film includes a negative photoresist.

In a possible embodiment of the present disclosure, the metal mask plate body includes a ferro-nickel alloy or a nickel-cobalt alloy.

In a possible embodiment of the present disclosure, the insulation film is doped with magnetic particles.

In a possible embodiment of the present disclosure, each magnetic particle includes an alloy material containing manganese, aluminium and carbon.

In a possible embodiment of the present disclosure, a width of each first opening in the row direction is not greater than 8.4 μm, and a pitch between two adjacent first openings in the row direction is not greater than 16.8 μm.

In another aspect, the present disclosure provides in some embodiments a method for manufacturing a mask plate, including steps of: providing a metal mask plate body provided with a plurality of first openings; forming an insulation film on the metal mask plate body; and forming a plurality of second openings in the insulation film through a patterning process, an orthogonal projection of at least one second opening in the plurality of second openings onto the metal mask plate body falling within the corresponding first opening.

In a possible embodiment of the present disclosure, the step of forming the insulation film on the metal mask plate body includes: doping magnetic particles into a negative photoresist solution, so as to acquire a mixture; and coating the mixture onto the metal mask plate body, and curing the mixture so as to form the insulation film.

In a possible embodiment of the present disclosure, the step of forming the plurality of second openings in the insulation layer through a patterning process includes exposing and developing the insulation film, so as to form the plurality of second openings in such a manner as to divide the insulation film into a plurality of insulation patterns. A cross section of each insulation pattern in a direction perpendicular to the metal mask plate body is of an inverted-trapezoidal shape.

In yet another aspect, the present disclosure provides in some embodiments a method for manufacturing an OLED display substrate, including steps of: securing the above-mentioned mask plate onto a frame; moving the frame in such a manner that positions of the second openings correspond to positions of subpixels in a first color respectively, and evaporating a light-emitting material to form the subpixels in the first color; moving the frame in such a manner that the positions of the second openings correspond to positions of subpixels in a second color respectively, and evaporating the light-emitting material to form the subpixels in the second color; and moving the frame in such a manner that the positions of the second openings correspond to positions of subpixels in a third color respectively, and evaporating the light-emitting material to form the subpixels in the third color. The subpixels in the first color, the second color and the third color are each capable of emitting a monochromatic light beam, and the monochromatic light beams from the subpixels in the first color, the second color and the third color are capable of being mixed into a white light beam.

In a possible embodiment of the present disclosure, the first color, the second color and the third color are R, G and B respectively.

In a possible embodiment of the present disclosure, each subpixel in the first color has a width not greater than 3 m.

In a possible embodiment of the present disclosure, each subpixel in the second color has a width not greater than 3 μm.

In a possible embodiment of the present disclosure, each subpixel in the third color has a width not greater than 3 μm.

In still yet another aspect, the present disclosure provides in some embodiments an OLED display substrate manufactured using the above-mentioned method.

In still yet another aspect, the present disclosure provides in some embodiments a display device including the above-mentioned OLED display substrate.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

REFERENCE SIGN LIST

Figure 1:
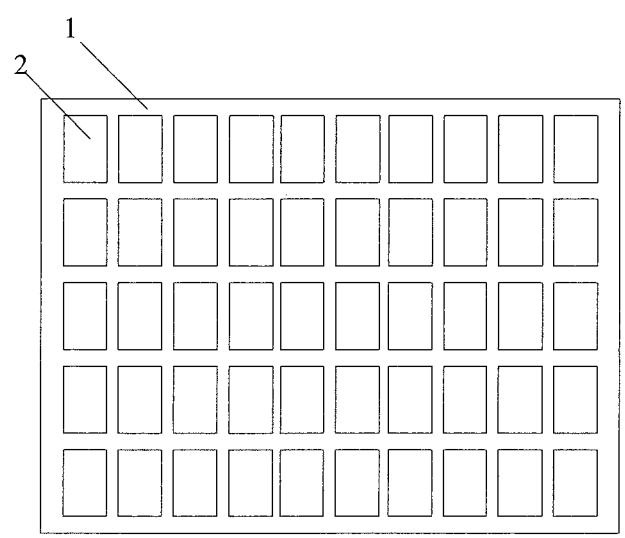
FIG. 1 is a schematic view showing a conventional FMM.

1 FMM
2 opening
3 metal mask plate body
4 first opening
5 second opening
6 insulation film
10 substrate to be vaporized

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments.

FMM technique is the most important technique in the OLED display industry. Currently, an FMM may be manufactured in five modes, i.e., 1) an etching mode, 2) an electroforming mode, 3) a mixed mode (etching+laser), 4) a laser mode, and 5) a pressurization mode. Although as the most mature mode, it is still for the metal etching mode to meet the requirement of manufacturing an OLED display product with a higher PPI value (greater than 400PPI).

Figure 2:
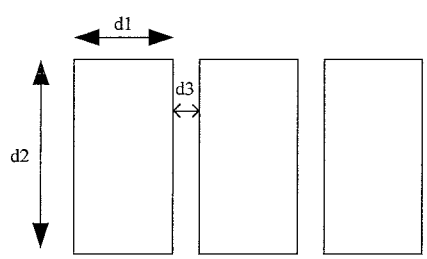
FIG. 2 is a schematic view showing a length and a width of each subpixel and a pitch between the adjacent subpixels for a conventional OLED display substrate.
Figure 3:
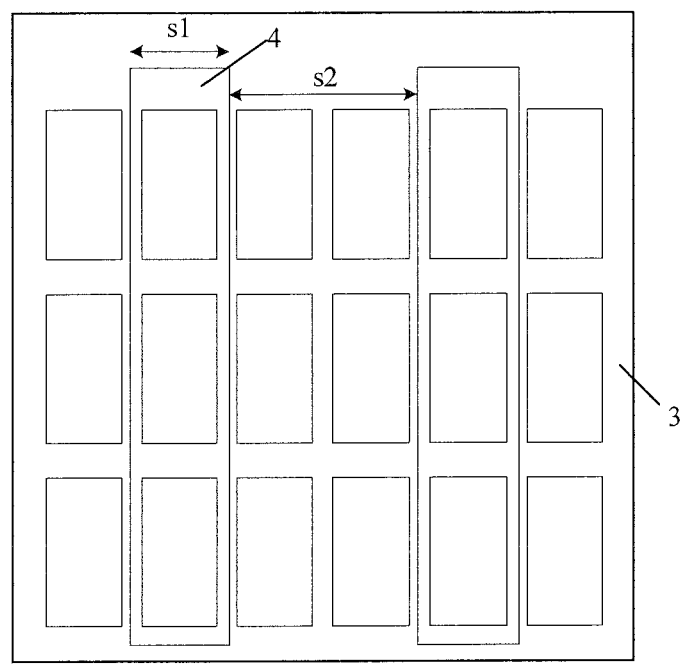
FIG. 3 and FIG. 4 are planar views of a mask plate according to one embodiment of the present disclosure.

Generally, for the conventional FMM technique, openings matching light-emitting regions are formed in the FMM made of a ferro-nickel alloy through etching. As shown in FIG. 1, numeral reference 1 represents the FMM, and numeral reference 2 represents the opening matching the light-emitting region. Then, a light-emitting material is evaporated so as to form subpixels in R, G and B in accordance with the practical need. Due to the limitation of the metal etching precision, it is impossible for a pitch between the adjacent openings in the FMM to meet the requirement of the display product with a high resolution and a high PPI value. As shown in FIG. 2, for a pixel having a size of 3 μm*5 μm (i.e., d1=3 μm and d2=5 μm), the pitch between two pixels, i.e., d3, may be 1.2 μm. As shown in FIG. 3, a width of each opening in the FMM in a row direction, i.e., s1, needs to be 4.2 μm, and the pitch, i.e., s2, needs to be 8.4 μm. However, due to the current processing precision, it is impossible to provide the FMM with the opening width of 4.2 μm and the pitch of 8.4 μm.

An object of the present disclosure is to provide a mask plate, an OLED display substrate, manufacturing methods thereof, and a display device, so as to provide the OLED display device with a high PPI value.

Figure 4:
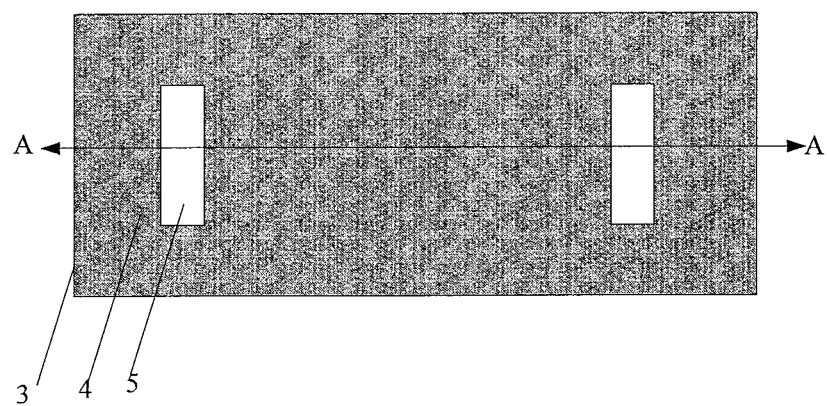
Figure 5:
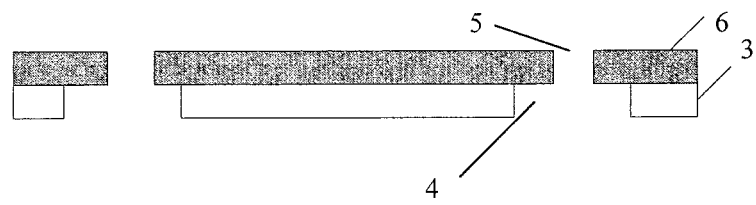
FIG. 5 and FIG. 6 are sectional views of the mask plate in FIG. 4 along a line indicated by AA.

The present disclosure provides in some embodiments a mask plate which, as shown in FIG. 3, FIG. 4 and FIG. 5, includes: a metal mask plate body 3 provided with a plurality of first openings 4; and an insulation film 6 arranged on the metal mask plate body 3 and provided with a plurality of second openings 5. An orthogonal projection of at least one second opening 5 in the plurality of second openings 5 onto the metal mask plate body 3 falls within the corresponding first opening 4. Here, the orthogonal projection of at least one second opening 5 in the plurality of second openings 5 onto the metal mask plate body 3 falls within the corresponding first opening 4 or first openings 4 includes the following two situations. The first situation is that the orthogonal projection of at least one second opening 5 in the plurality of second openings 5 onto the metal mask plate body 3 completely falls within an area of the corresponding first opening 4 or first openings 4. And the second situation is that the orthogonal projection of at least one second opening 5 in the plurality of second openings 5 onto the metal mask plate body 3 completely coincides with an area of the corresponding first opening 4 or first openings 4.

According to the mask plate in the embodiments of the present disclosure, due to the relatively low etching precision of the metal mask plate body, each first opening in the metal mask plate body may be of a relatively large size. The insulation film is formed on the metal mask plate body, and then etched to acquire the second openings. Due to the relatively high etching precision of the insulation film, each second opening may be of a relatively small size, and the orthogonal projection of the second opening onto the metal mask plate body falls within the corresponding first opening. A light-emitting material may be evaporated through the second openings, so as to from subpixels of an OLED display substrate. As a result, it is able to acquire the OLED display substrate with a high PPI value.

As shown in FIG. 4 and FIG. 5, the second openings 5 may correspond to the first openings 4 respectively, namely in a one-to-one correspondence. Of course, each first opening 4 may also correspond to more than one second opening 5, as long with the orthogonal projections of these second openings 5 onto the metal mask plate body 3 fall within the corresponding first opening 4.

To be specific, the plurality of second openings is arranged in an array form. Due to the limitation of the etching precision of the metal mask plate body, a pitch between two adjacent second openings may not be too small. Hence, the light-emitting material may be evaporated each time through the second openings so as to form the subpixels in merely one color. For example, the light-emitting material may be evaporated through the second openings to form the subpixels in a first color, then the mask plate may be moved so as to evaporate the light-emitting material through the second openings to form the subpixels in a second color, and then the mask plate may be moved again so as to evaporate the light-emitting material through the second openings to form the subpixels in a third color. The subpixels in each color are arranged on the OLED display substrate in columns, and the subpixels in different colors are arranged sequentially and periodically in each row. Hence, the pitch between the two adjacent second openings in a row direction needs to be not smaller than twice a width of each second opening in the row direction.

In a possible embodiment of the present disclosure, the width of each second opening is not greater than 4.2 μm in the row direction, and the pitch between the two adjacent second openings is not greater than 8.4 μm. In this way, a width of a resultant subpixel may be as small as 3 μm, so it is able to provide a higher PPI value. In the embodiments of the present disclosure, a size of each first opening is not particularly defined. To be specific, the metal mask plate body may be etched using a conventional etching process, so as to form the plurality of first openings. The size of each first opening may be 8.4 μm, and a pitch between two adjacent first openings may be 16.8 μm. The size of the subpixel is not deteimined by the size of the first opening, and instead, it is associated with the size of the second opening. In order to support the insulation film in a sufficient manner, the size of each first opening shall not be too large. In a possible embodiment of the present disclosure, each first opening corresponds to one or two second openings, and the orthogonal projections of the second openings corresponding to each first opening onto the metal mask plate body fall entirely within the first opening.

Figure 6:
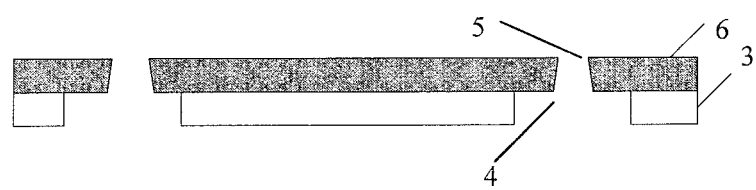
Figure 7:
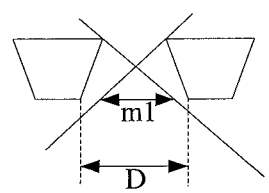
FIG. 7 through FIG. 9 are schematic views showing a shadow effect.
Figure 8:
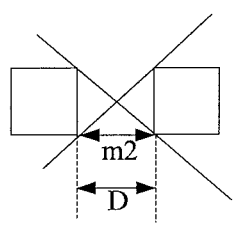
Figure 9:
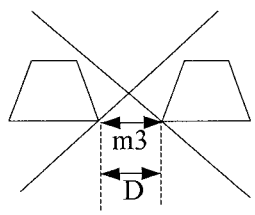

In a possible embodiment of the present disclosure, the insulation film 6 is divided by the second openings into a plurality of insulation patterns. As shown in FIG. 6, a cross section of each insulation pattern in a direction perpendicular to the metal mask plate body is of an inverted-trapezoidal shape, so as to prevent the occurrence of shadow effect. In FIG. 7 through FIG. 9, D represents a distance between bottom portions of two adjacent insulation patterns, and m1, m2 and m3 each represents the width of the subpixel formed by evaporating the light-emitting material through the opening between the two adjacent insulation patterns. As shown in FIG. 7, m1 corresponding to the insulation patterns each having the inverted-trapezoidal cross section has the minimum value. In other words, through the insulation patterns each having the inverted-trapezoidal cross section, it is able to prevent the occurrence of the shadow effect to greatest extent. In this way, in the case of evaporating the light-emitting material through the mask plate, it is able to reduce a region where the light-emitting material is deposited, thereby to prevent the occurrence of cross color between two adjacent subpixels.

Further, the insulation film 6 includes a negative photoresist, so as to facilitate the formation of the inverted-trapezoidal insulation patterns. The metal mask plate body 3 includes a ferro-nickel alloy or a nickel-cobalt alloy.

Further, the insulation film 6 is doped with magnetic particles, so as to tightly attach the insulation film 6 onto the metal mask plate body 3, and prevent the insulation film 6 from falling off from the metal mask plate body 3. In addition, during the evaporation, the insulation film 6 may also be tightly attached onto a to-be-evaporated substrate under the effect of a magnetic field, so as to reduce the region where the light-emitting material is deposited, thereby to prevent the occurrence of cross color between the adjacent subpixels. Each magnetic particle may be made of an alloy material containing manganese, aluminium and carbon.

The present disclosure further provides in some embodiments a method for manufacturing a mask plate, including steps of: providing a metal mask plate body provided with a plurality of first openings; forming an insulation film on the metal mask plate body; and forming a plurality of second openings in the insulation film through a patterning process, an orthogonal projection of at least one second opening in the plurality of second openings onto the metal mask plate body falling within the corresponding first opening.

According to the method in the embodiments of the present disclosure, due to the relatively low etching precision of the metal mask plate body, each first opening in the metal mask plate body may be of a relatively large size. The insulation film is formed on the metal mask plate body, and then etched to acquire the second openings. Due to the relatively high etching precision of the insulation film, each second opening may be of a relatively small size, and the orthogonal projection of the second opening onto the metal mask plate body falls within the corresponding first opening. A light-emitting material may be evaporated through the second openings, so as to from subpixels of an OLED display substrate. As a result, it is able to acquire the OLED display substrate with a high PPI value.

Further, the step of forming the insulation film on the metal mask plate body includes: doping magnetic particles into a negative photoresist solution, so as to acquire a mixture; and coating the mixture onto the metal mask plate body, and curing the mixture so as to form the insulation film.

Through the magnetic particles, it is able to tightly attach the insulation film onto the metal mask plate body, and prevent the insulation film from easily falling off from the metal mask plate body. In addition, during the evaporation, it is also able to tightly attach the insulation film onto a to-be-evaporated substrate under the effect of a magnetic field.

Further, the step of forming the plurality of second openings in the insulation layer through a patterning process includes exposing and developing the insulation film, so as to form the plurality of second openings in such a manner as to divide the insulation film into a plurality of insulation patterns. A cross section of each insulation pattern in a direction perpendicular to the metal mask plate body is of an inverted-trapezoidal shape. Through the insulation pattern with the inverted-trapezoidal cross section, it is able to prevent the occurrence of a shadow effect, so as to reduce a region where the light-emitting material is deposited during the evaporation using the mask plate, thereby to prevent the occurrence of cross color between the adjacent subpixels.

In a possible embodiment of the present disclosure, the insulation film may be made of polyimide (PI).

Figure 10:
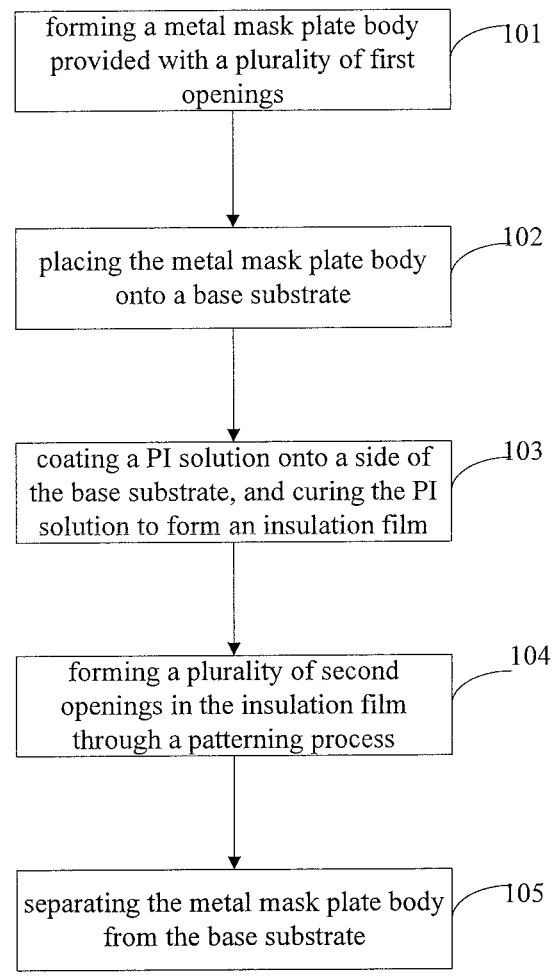
FIG. 10 is a flow chart of a method for manufacturing the mask plate according to one embodiment of the present disclosure.

As shown in FIG. 10, the method for manufacturing the mask plate specifically includes the following steps.

Step 101: forming the metal mask plate body provided with the plurality of first openings.

Step 102: placing the metal mask plate body onto a base substrate.

Step 103: coating a PI solution onto a side of the base substrate where the metal mask plate body is placed, and curing the PI solution to form the insulation film. The PI solution may contain the magnetic particles, and each magnetic particle may be made of an alloy material containing manganese, aluminium and carbon.

Step 104: forming the plurality of second openings in the insulation film through a patterning process. Each second opening corresponds to one first opening, and the orthogonal projection of the second opening onto the metal mask plate body falls within the corresponding first opening.

Step 105: separating the metal mask plate body from the base substrate, so as to acquire the mask plate.

Then, in the case of manufacturing the OLED display substrate, the resultant mask plate may be secured onto a frame.

The present disclosure further provides in some embodiments a method for manufacturing an OLED display substrate, including steps of: securing the above-mentioned mask plate onto a frame; moving the frame in such a manner that positions of the second openings correspond to positions of subpixels in a first color respectively, and evaporating a light-emitting material to form the subpixels in the first color; moving the frame in such a manner that the positions of the second openings correspond to positions of subpixels in a second color respectively, and evaporating the light-emitting material to form the subpixels in the second color; and moving the frame in such a manner that the positions of the second openings correspond to positions of subpixels in a third color respectively, and evaporating the light-emitting material to form the subpixels in the third color. The subpixels in the first color, the second color and the third color are each capable of emitting a monochromatic light beam, and the monochromatic light beams from the subpixels in the first color, the second color and the third color are capable of being mixed into a white light beam.

For example, the first color, the second color and the third color are R, G and B respectively. Of course, these colors may not be limited thereto, and the subpixels may emit light in any other appropriate monochromatic light beams, which will not be particularly defined herein.

Due to the limitation of the etching precision of the metal mask plate body, the pitch between the two adjacent second openings cannot be too small. Hence, the light-emitting material may be evaporated each time through the second openings to merely form the subpixels in one color. For example, at first, the light-emitting material may be evaporated through the second openings to form the subpixels in the first color. Then, the mask plate may be moved, and the light-emitting material may be evaporated through the second openings to form the subpixels in the second color. And then, the mask plate may be moved again, and the light-emitting material may be evaporated through the second openings to form the subpixels in the third color.

The present disclosure further provides in some embodiments an OLED display substrate manufactured using the above-mentioned method. A size of each subpixel of the OLED display substrate depends on a size of each second opening. Due to the relatively high etching precision of the insulation film, it is able to acquire the second opening with a small size. A light-emitting material may be evaporated through the second openings so as to form the subpixels of the OLED display substrate. Because the size of the second opening is not affected by the etching precision of the metal mask plate body, it is able to acquire the OLED display substrate with a high PPI value.

The present disclosure further provides in some embodiments a display device including the above-mentioned OLED display substrate. The display device may be any product or member having a display function, e.g., television, display, digital photo frame, mobile phone or flat-panel computer. The display device further includes a flexible circuit board, a printed circuit board and a back plate. As mentioned above, the OLED display substrate may have a high PPI value, e.g., greater than 400PPI.

Figure 11:
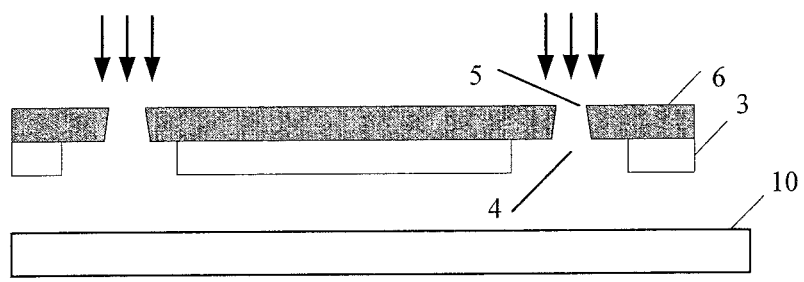
FIG. 11 is a sectional view of the mask plate in FIG. 4 along a line indicated by AA, in reference to a substrate to be vaporized.

In addition, FIG. 11 shows a sectional view of the mask plate in FIG. 4 along a line indicated by AA, in reference to a substrate 10 to be vaporized. In FIG. 11, these arrows in black indicate a direction for evaporating the light-emitting material on the substrate 10 to be vaporized, which is described in reference with FIG. 10. Also shown in FIG. 11, it is clear that there is a space between the mask plate and the substrate 10 to be vaporized when the method is performed in accordance with FIG. 10.

In the embodiments of the present disclosure, the order of the steps is not limited to the serial numbers thereof. For a person skilled in the art, any change in the order of the steps shall also fall within the scope of the present disclosure if without any creative effort.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other substrate, or an intermediate element may be arranged therebetween.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A mask plate used for a substrate to be vaporized, comprising:
   a metal mask plate body proximal to the substrate to be vaporized, the metal mask plate body being provided with a plurality of first openings; and
   an insulation film arranged on the metal mask plate body and distal to the substrate to be vaporized, provided with a plurality of second openings,
   wherein an area of an orthogonal projection of at least one second opening in the plurality of second openings onto the metal mask plate body is smaller than that of the corresponding first opening or first openings;
   wherein the insulation film is divided by the plurality of second openings into a plurality of insulation patterns, and a cross section of each insulation pattern in a direction perpendicular to the metal mask plate body is of a trapezoidal shape; and
   wherein the cross section of each insulation pattern from top to bottom in a direction perpendicular to the metal mask plate body is of an inverted-trapezoidal shape.

2. The mask plate according to claim 1, wherein the plurality of second openings corresponds to the plurality of first openings in a one-to-one correspondence.

3. The mask plate according to claim 2, wherein the plurality of second openings is arranged in an array form, and a pitch between two adjacent second openings in a row direction is not smaller than twice of a width of each second opening in the row direction.

4. The mask plate according to claim 3, wherein the width of each second opening in the row direction is not greater than 4.2 μm, and the pitch between the two adjacent second openings in the row direction is not greater than 8.4 μm.

5. The mask plate according to claim 1, wherein the insulation film includes a negative photoresist; and
   wherein the metal mask plate body includes a ferro-nickel alloy or a nickel-cobalt alloy.

6. The mask plate according to claim 1, wherein the insulation film is doped with magnetic particles.

7. The mask plate according to claim 6, wherein each magnetic particle includes an alloy material containing manganese, aluminium and carbon.

8. The mask plate according to claim 1, wherein a width of each first opening in the row direction is not greater than 8.4 μm, and a pitch between two adjacent first openings in the row direction is not greater than 16.8 μm.

9. The mask plate according to claim 1, wherein there exists a space between the mask plate and the substrate to be vaporized when the mask plate is in use.

10. A method for manufacturing a mask plate used for a substrate to be vaporized, comprising:
    providing a metal mask plate body proximal to the substrate to be vaporized, the metal mask plate body being provided with a plurality of first openings;
    forming an insulation film on the metal mask plate body distal to the substrate to be vaporized; and
    forming a plurality of second openings in the insulation film through a patterning process, wherein an area of an orthogonal projection of at least one second opening in the plurality of second openings onto the metal mask plate body is smaller than that of the corresponding first opening,
    wherein the insulation film is divided by the plurality of second openings into a plurality of insulation patterns, and a cross section of each insulation pattern in a direction perpendicular to the metal mask plate body is of a trapezoidal shape; and
    wherein the cross section of each insulation pattern from top to bottom in a direction perpendicular to the metal mask plate body is of an inverted-trapezoidal shape.

11. The method according to claim 10, wherein the forming the insulation film on the metal mask plate body comprises:
    doping magnetic particles into a negative photoresist solution, so as to acquire a mixture; and
    coating the mixture onto the metal mask plate body, and curing the mixture so as to form the insulation film.

12. A method for manufacturing an organic light-emitting diode (OLED) display substrate, comprising:
    securing the mask plate according to claim 1 onto a frame;
    moving the frame in such a manner that positions of the plurality of second openings correspond to positions of subpixels in a first color respectively, and evaporating a light-emitting material to form the subpixels in the first color;
    moving the frame in such a manner that the positions of the plurality of second openings correspond to positions of subpixels in a second color respectively, and evaporating the light-emitting material to form the subpixels in the second color; and
    moving the frame in such a manner that the positions of the plurality of second openings correspond to positions of subpixels in a third color respectively, and evaporating the light-emitting material to form the subpixels in the third color,
    wherein the subpixels in the first color, the second color and the third color are each capable of emitting a monochromatic light beam, and the monochromatic light beams from the subpixels in the first color, the second color and the third color are capable of being mixed into a white light beam.

13. The method according to claim 12, wherein the first color, the second color and the third color are red (R), green (G) and blue (B) respectively.

14. The method according to claim 12, wherein each subpixel in the first color has a width not greater than 3 μm.

15. The method according to claim 12, wherein each subpixel in the second color has a width not greater than 3μm.

16. The method according to claim 12, wherein each subpixel in the third color has a width not greater than 3μm.

17. An organic light-emitting diode (OLED) display substrate, manufactured using the method according to claim 12.

18. A display device, comprising the OLED display substrate according to claim 17.

19. The method according to claim 10, wherein there exists a space between the mask plate and the substrate to be vaporized when the mask plate is in use.

* * * * *